(12) United States Patent
Ito

(10) Patent No.: US 11,289,965 B2
(45) Date of Patent: Mar. 29, 2022

(54) RESIN MULTILAYER SUBSTRATE, ACTUATOR, AND METHOD OF MANUFACTURING RESIN MULTILAYER SUBSTRATE

(71) Applicant: Murata Manufacturing Co., Ltd., Nagaokakyo (JP)

(72) Inventor: Shingo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 63 days.

(21) Appl. No.: 17/008,987

(22) Filed: Sep. 1, 2020

(65) Prior Publication Data

US 2020/0395803 A1 Dec. 17, 2020

Related U.S. Application Data

(63) Continuation of application No. PCT/JP2019/010267, filed on Mar. 13, 2019.

(30) Foreign Application Priority Data

Mar. 28, 2018 (JP) .............................. JP2018-061883

(51) Int. Cl.
*H02K 3/26* (2006.01)
*H02K 41/025* (2006.01)

(52) U.S. Cl.
CPC ............. *H02K 3/26* (2013.01); *H02K 41/025* (2013.01); *H02K 2203/03* (2013.01)

(58) Field of Classification Search
CPC .. H02K 3/00; H02K 3/26; H02K 3/46; H02K 41/00; H02K 41/02; H02K 41/025;
(Continued)

(56) References Cited

U.S. PATENT DOCUMENTS 7,135,951 B1 * 11/2006 Sidhu .................. H01F 17/0013
336/200
2011/0050380 A1 3/2011 Nakanishi
(Continued)

FOREIGN PATENT DOCUMENTS

JP 57053916 * 3/1982 ......... H01F 17/0013
JP 08-203736 A 8/1996
(Continued)

OTHER PUBLICATIONS

Official Communication issued in International Patent Application No. PCT/JP2019/010267, dated May 28, 2019.

*Primary Examiner* — Tran N Nguyen
(74) *Attorney, Agent, or Firm* — Keating & Bennett, LLP

(57) ABSTRACT

A resin multilayer substrate includes a stacked body including resin layers, and a coil including coil conductor patterns provided on two or more resin layers. The coil conductor patterns include a coil conductor pattern including a parallel conductor portion. The parallel conductor portion includes linear conductor patterns connected in parallel that are parallel to each other, and is provided at least at a portion of an outermost peripheral portion of the coil conductor pattern. A total line width of the linear conductor patterns of the parallel conductor portion is larger than a line width of other portions of the coil conductor pattern.

20 Claims, 12 Drawing Sheets

(58) Field of Classification Search
CPC ...... H02K 41/03; H02K 41/031; H02K 41/04;
H02K 7/00; H02K 7/14; H05K 1/16;
H05K 3/00; H05K 3/46; H01F 17/00;
H01F 17/0013; H01F 17/0033; H01F
27/00; H01F 27/32; H01F 27/323; H01F
27/28; H01F 27/28; H01F 27/2804; H01F
27/287; H01F 27/2871; H01F 27/29;
H01F 27/292; H01F 27/40; H01F 41/00;
H01F 41/04; H01F 5/00
See application file for complete search history.

(56) References Cited

U.S. PATENT DOCUMENTS

| | | | |
|---|---|---|---|
| 2018/0047491 A1* | 2/2018 | Katsuta | H01F 27/292 |
| 2018/0061554 A1* | 3/2018 | Okura | H01F 27/2804 |
| 2018/0277293 A1 | 9/2018 | Ito et al. | |

FOREIGN PATENT DOCUMENTS

| | | |
|---|---|---|
| JP | 08-203739 A | 8/1996 |
| JP | 2001-250721 A | 9/2001 |
| JP | 2001-319813 A | 11/2001 |
| JP | 2004-047849 A | 2/2004 |
| JP | 2004-080023 A | 3/2004 |
| JP | 2005-252272 A | 9/2005 |
| JP | 2011-049220 A | 3/2011 |
| JP | 2013-251378 A | 12/2013 |
| WO | 2017/104309 A1 | 6/2017 |

\* cited by examiner

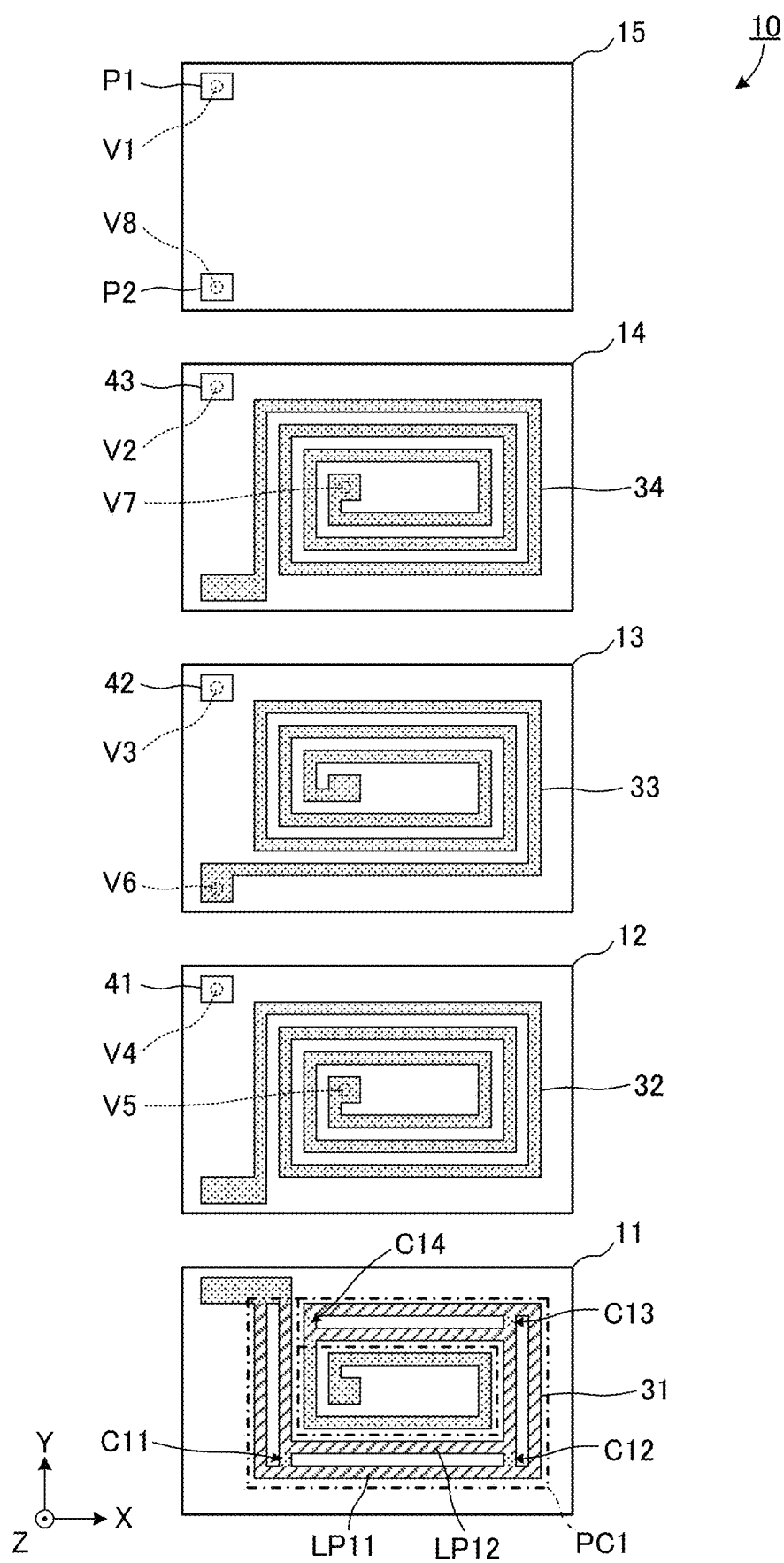

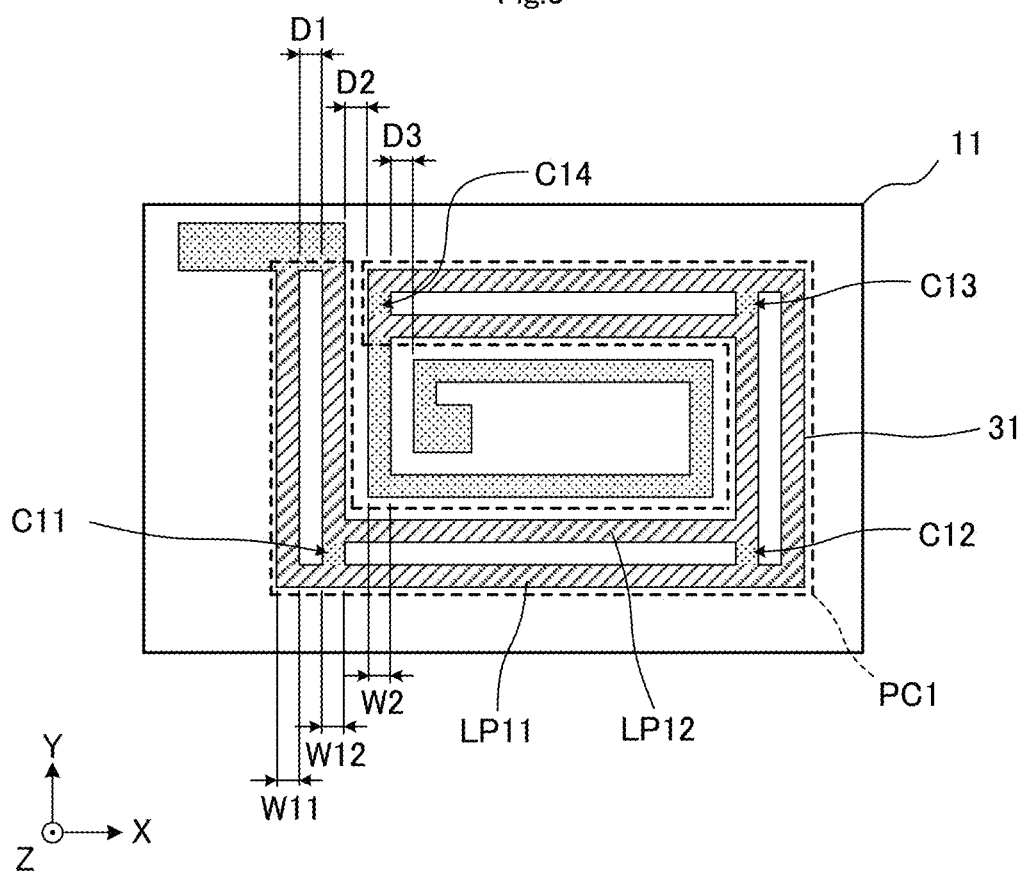

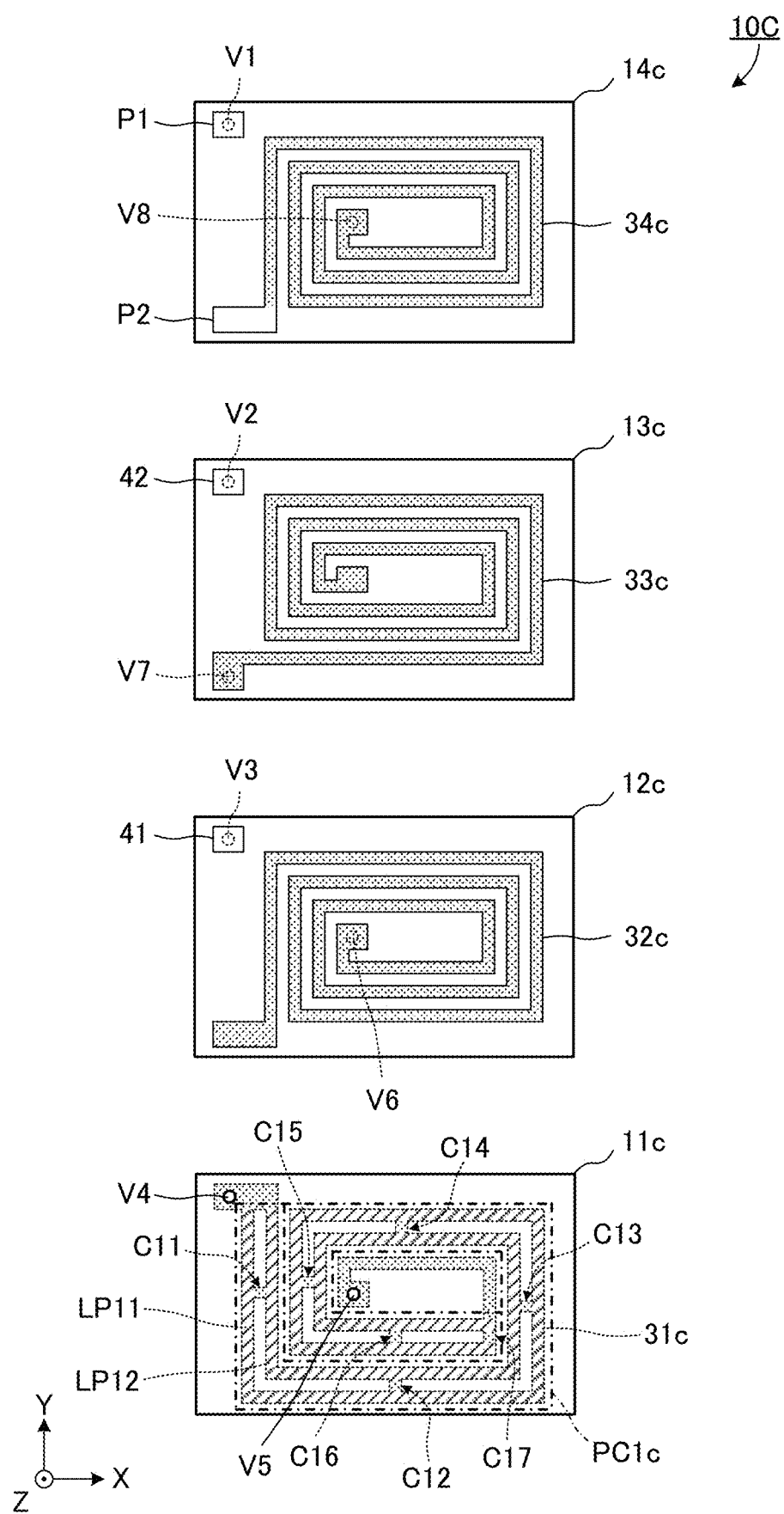

RESIN MULTILAYER SUBSTRATE, ACTUATOR, AND METHOD OF MANUFACTURING RESIN MULTILAYER SUBSTRATE

CROSS REFERENCE TO RELATED APPLICATIONS

This application claims the benefit of priority to Japanese Patent Application No. 2018-061883 filed on Mar. 28, 2018 and is a Continuation Application of PCT Application No. PCT/JP2019/010267 filed on Mar. 13, 2019. The entire contents of each application are hereby incorporated herein by reference.

BACKGROUND OF THE INVENTION

1. Field of the Invention

The present invention relates to a resin multilayer substrate, and more particularly to a resin multilayer substrate including a stacked body including a plurality of resin layers and a coil that are stacked in the stacked body. Further, the present invention also relates to an actuator including the resin multilayer substrate, and a method of manufacturing the resin multilayer substrate.

2. Description of the Related Art

Conventionally, there have been known various resin multilayer substrates including a stacked body including a plurality of resin layers that are stacked and a coil including a plurality of coil conductor patterns provided on the plurality of resin layers.

For example, WO 2017/104309 A discloses a resin multilayer substrate including a coil conductor pattern in which a line width of a portion (outermost peripheral portion) is larger than a line width of the other coil conductor patterns. According to this configuration, the conductor loss of the coil can be reduced without increasing the size of the stacked body. Further, the coil conductor pattern having a large line width suppresses excessive flow of a resin at the time of hot pressing when forming the stacked body, so that positional deviation (or deformation) of the coil conductor pattern at the time of hot pressing is suppressed.

However, if the line widths of the plurality of coil conductor patterns are different (if there are coil conductor patterns with different line widths), this causes irregular resin flow at the time of hot pressing, with the result that positional deviation of the other coil conductor patterns may be caused.

SUMMARY OF THE INVENTION

Preferred embodiments of the present invention provide resin multilayer substrates which are each able to reduce conductor loss of a coil while reducing or preventing positional deviation of coil conductor patterns by regulating flow of resin at a time of hot pressing.

A resin multilayer substrate according to a preferred embodiment of the present invention includes a stacked body including a plurality of resin layers that are stacked, and a coil including a plurality of coil conductor patterns provided on two or more resin layers of the plurality of resin layers, in which the plurality of coil conductor patterns include a coil conductor pattern in which a parallel conductor portion in which a plurality of linear conductor patterns connected in parallel are parallel or substantially parallel to each other is provided in at least a portion of an outermost peripheral portion, and in which a total line width of the plurality of linear conductor patterns of the parallel conductor portion is larger than a line width of other portions of the coil conductor pattern.

In this configuration, the parallel conductor portion is provided in at least a portion of the outermost peripheral portion of the coil conductor pattern. In addition, the total line width of the plurality of linear conductor patterns of the parallel conductor portion is larger than the line width of other portions of the coil conductor pattern in which the parallel conductor portion is provided. According to this configuration, the parallel conductor portion reduces or prevents excessive flow of a resin at the time of hot pressing when forming the stacked body, and reduces the conductor loss of the coil.

If there are a plurality of coil conductor patterns with different line widths, the flow of the resin at the time of hot pressing may become irregular, with the result that positional deviation (or deformation) of the coil conductor patterns may be caused. On the other hand, according to this configuration, since the parallel conductor portion is provided in the coil conductor pattern, as compared to the case where a line width of one coil conductor pattern is increased without providing the parallel conductor portion, the regularity of the flow of the resin at the time of hot pressing is maintained. Therefore, the positional deviation of the coil conductor patterns at the time of hot pressing is further reduced or prevented.

In a preferred embodiment of the present invention, the parallel conductor portion may be provided on the entire or substantially the entire outermost peripheral portion of the coil conductor pattern. The outermost peripheral portion of the coil conductor pattern has a relatively larger conductor length than other portions (for example, the inner peripheral portion of the coil conductor pattern). Therefore, by providing the parallel conductor portion on the entire or substantially the entire outermost peripheral portion of the coil conductor pattern, the conductor loss of the coil is able to be significantly reduced.

In a preferred embodiment of the present invention, the parallel conductor portion may include a straight portion in which the plurality of linear conductor patterns are linearly parallel or substantially parallel to each other, and a connecting portion that connects the linear conductor patterns to each other near a center of the straight portion.

The long straight portion in which the plurality of linear conductor patterns are linearly parallel or substantially parallel to each other is likely to be deformed (or positionally deviated) due to the flow of a resin at the time of hot pressing. Therefore, when the straight portion is provided, problems such as characteristic changes of the coil or a short circuit are likely to occur after the stacked body is formed. On the other hand, according to this configuration, by connecting the portions near the centers of the straight portions to each other, it is possible to effectively reduce or prevent the deformation of the straight portions due to the flow of the resin at the time of hot pressing. Therefore, it is possible to effectively reduce or prevent the occurrence of a characteristic change of the coil or a short circuit due to the deformation of the straight portion.

In a preferred embodiment of the present invention, the coil conductor pattern provided with the parallel conductor portion may be arranged closest to a surface layer in a stacking direction of the plurality of resin layers among the plurality of coil conductor patterns. When a stacked body is formed by subjecting the plurality of stacked resin layers to hot pressing, the portion near the surface layer of the stacked body is particularly susceptible to heat of a pressing machine at the time of hot pressing, and the coil conductor pattern arranged near the surface layer of the stacked body is likely to be positionally deviated. Therefore, by arranging the coil conductor pattern having the parallel conductor portion closest to the surface layer, the positional deviation of the coil conductor patterns can be effectively reduced or prevented.

In a preferred embodiment of the present invention, the stacked body may include a first main surface and a second main surface that oppose each other in a stacking direction of the plurality of resin layers, and the coil conductor pattern provided with the parallel conductor portion may be closest to the first main surface among the plurality of coil conductor patterns.

In a preferred embodiment of the present invention, a plurality of the coil conductor patterns provided with the parallel conductor portion may be provided. With this configuration, the conductor loss of the coil is further reduced, and the effect of reducing or preventing the positional deviation of the coil conductor patterns is further improved.

In a preferred embodiment of the present invention, the stacked body may include a first main surface and a second main surface that oppose each other in a stacking direction of the plurality of resin layers, and the plurality of coil conductor patterns provided with the parallel conductor portion may be arranged at a position closest to the first main surface and a position closest to the second main surface, respectively, among the plurality of coil conductor patterns. According to this configuration, it is possible to effectively reduce or prevent positional deviation of the two coil conductor patterns arranged at the positions closer to both the main surfaces (first main surface and second main surface) of the stacked body that are susceptible to heat of the pressing machine at the time of hot pressing.

An actuator according to a preferred embodiment of the present invention includes a resin multilayer substrate according to a preferred embodiment of the present invention; and a magnet, in which the coil has a winding axis in the stacking direction, and in which the magnet is arranged at a position overlapping a formation region of the coil when viewed in a winding axis direction of the coil, and is arranged closer to the second main surface than the first main surface.

The number of turns per unit area of the coil conductor pattern including the parallel conductor portion is smaller than that of other coil conductor patterns. Generally, when the number of turns of the coil conductor pattern is large, the magnetic flux density generated around the coil conductor pattern is higher. Therefore, by arranging the coil conductor pattern provided with the parallel conductor portion at a position farther from the magnet than the other coil conductor patterns, it is possible to reduce or prevent the conductor loss of the coil while reducing or preventing the reduction of the electromagnetic force due to the interaction between the magnet and the coil.

A method of manufacturing a resin multilayer substrate according to a preferred embodiment of the present invention includes a coil conductor forming step of forming a plurality of coil conductor patterns on two or more resin layers; and a stacked body forming step of stacking, after the coil conductor forming step, a plurality of the resin layers including the resin layers on which the plurality of coil conductor patterns are formed, and subjecting the plurality of stacked resin layers to hot pressing to form a stacked body, in which the coil conductor forming step includes a step of forming a coil conductor pattern in which a parallel conductor portion in which a plurality of linear conductor patterns are connected in parallel to each other in parallel or substantially in parallel, and a total line width of the plurality of linear conductor patterns larger than a line width of other portions is provided in at least a portion of an outermost peripheral portion.

According to this manufacturing method, it is possible to easily manufacture the resin multilayer substrate which can reduce the conductor loss of the coil while reducing or preventing the positional deviation of the coil conductor patterns by regulating the flow of the resin at the time of hot pressing.

According to preferred embodiments of the present invention, it is possible to obtain resin multilayer substrates that each reduce conductor loss of a coil while reducing or preventing positional deviation of coil conductor patterns by regulating the flow of the resin at the time of hot pressing.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is an exploded plan view of a stacked body 10 included in the resin multilayer substrate 101.

FIG. 3 is an enlarged plan view of a resin layer 11 defining a portion of the stacked body 10.

FIG. 10 is an exploded plan view of a stacked body 10C included in the resin multilayer substrate 104.

DETAILED DESCRIPTION OF THE PREFERRED EMBODIMENTS

Figure 1A:
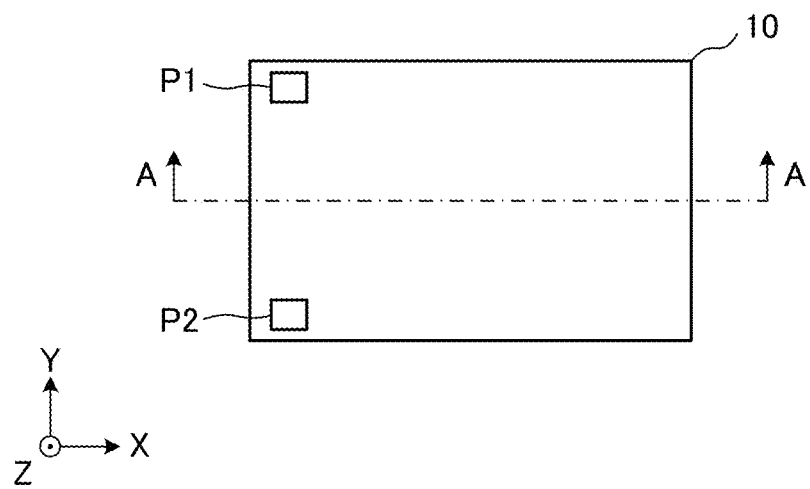
FIG. 1A is a plan view of a resin multilayer substrate 101 according to a first preferred embodiment of the present invention.

Preferred embodiments of the present invention will be shown and described with some specific examples with reference to the drawings. In each figure, the same or similar elements and portions are designated by the same reference numerals. Although the preferred embodiments are shown separately for convenience in consideration of the description of main points or the ease of understanding, partial replacement or combination of elements and configurations shown in the different preferred embodiments is possible. In the second and subsequent preferred embodiments, description of matters common to the first preferred embodiment will be omitted, and only different points will be described. In particular, similar actions and advantageous effects obtained by the same or similar elements and configurations will not be sequentially described for each preferred embodiment.

First Preferred Embodiment

Figure 1B:
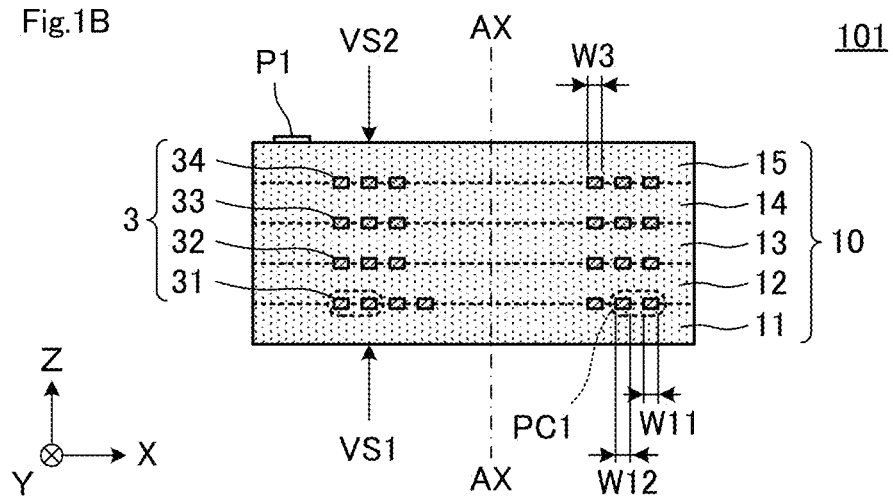
FIG. 1B is a sectional view taken along line A-A in FIG. 1A.

FIG. 1A is a plan view of a resin multilayer substrate 101 according to a first preferred embodiment of the present invention, and FIG. 1B is a sectional view taken along line A-A in FIG. 1A. FIG. 2 is an exploded plan view of a stacked body 10 included in the resin multilayer substrate 101. FIG. 3 is an enlarged plan view of a resin layer 11 defining a portion of the stacked body 10. In FIG. 2 and FIG. 3, coil conductor patterns 31, 32, 33, and 34 are shown by dot patterns in order to make the structure easy to understand. Further, in FIG. 2 and FIG. 3, linear conductor patterns LP11 and LP12 are shown by hatching.

The resin multilayer substrate 101 includes the stacked body 10, a coil 3 (described in detail later), input/output electrodes P1 and P2, and the like.

The stacked body 10 is a rectangular or substantially rectangular parallelepiped whose longitudinal direction coincides with an X-axis direction, and includes a first main surface VS1 and a second main surface VS2 that oppose each other in a Z-axis direction. Input/output electrodes P1 and P2 are provided on the second main surface VS2 of the stacked body 10.

The stacked body 10 includes a plurality of resin layers 11, 12, 13, 14, and 15 made of, for example, a thermoplastic resin that are stacked in this order. Each of the plurality of resin layers 11, 12, 13, 14, and 15 is a rectangular or substantially rectangular flat plate having flexibility and including a longitudinal direction that coincides with the X-axis direction. The plurality of resin layers 11, 12, 13, 14, and 15 are sheets whose main material is preferably, for example, liquid crystal polymer (LCP) or polyether ether ketone (PEEK).

The coil conductor pattern 31 is provided on the front surface of the resin layer 11. The coil conductor pattern 31 is a spiral conductor pattern arranged near the center of the resin layer 11. The coil conductor pattern 31 includes a parallel conductor portion PC1 of about 1 turn over the entire or substantially the entire outermost peripheral portion. The parallel conductor portion PC1 is a portion where the plurality of linear conductor patterns LP11 and LP12 connected in parallel are parallel or substantially parallel to each other. The plurality of linear conductor patterns LP11 and LP12 are connected to each other in parallel by connecting portions C11, C12, C13, and C14. The coil conductor pattern 31 is a conductor pattern such as, for example, a Cu foil.

The "outermost peripheral portion" refers to a portion located on an outermost side (about 1 turn) of the spiral (or loop) coil conductor pattern.

The coil conductor pattern 32 and a conductor 41 are provided on the front surface of the resin layer 12. The coil conductor pattern 32 is a spiral conductor pattern arranged near the center of the resin layer 12, and the conductor 41 is a rectangular or substantially rectangular conductor pattern arranged near a first corner of the resin layer 12 (upper left corner of the resin layer 12 in FIG. 2). The coil conductor pattern 32 and the conductor 41 are conductor patterns such as, for example, a Cu foil. Further, interlayer connection conductors V4 and V5 are provided on the resin layer 12.

The coil conductor pattern 33 and a conductor 42 are provided on the front surface of the resin layer 13. The coil conductor pattern 33 is a spiral conductor pattern arranged near the center of the resin layer 13, and the conductor 42 is a rectangular or substantially rectangular conductor pattern arranged near a first corner of the resin layer 13 (upper left corner of the resin layer 13 in FIG. 2). The coil conductor pattern 33 and the conductor 42 are conductor patterns such as, for example, a Cu foil. Further, interlayer connection conductors V3 and V6 are provided on the resin layer 13.

The coil conductor pattern 34 and a conductor 43 are provided on the front surface of the resin layer 14. The coil conductor pattern 34 is a spiral conductor pattern arranged near the center of the resin layer 14, and the conductor 43 is a rectangular or substantially rectangular conductor pattern arranged near a first corner of the resin layer 14 (upper left corner of the resin layer 14 in FIG. 2). The coil conductor pattern 34 and the conductor 43 are conductor patterns such as, for example, a Cu foil. Further, interlayer connection conductors V2 and V7 are provided on the resin layer 14.

On the front surface of the resin layer 15, the rectangular or substantially rectangular input/output electrodes P1 and P2 are provided. The input/output electrode P1 is a rectangular or substantially rectangular conductor pattern arranged near a first corner of the resin layer 15 (upper left corner of the resin layer 15 in FIG. 2). The input/output electrode P2 is a rectangular or substantially rectangular conductor pattern arranged near a second corner of the resin layer 15 (lower left corner of the resin layer 15 in FIG. 2). The input/output electrodes P1 and P2 are conductor patterns such as, for example, a Cu foil. In addition, interlayer connection conductors V1 and V8 are provided on the resin layer 15.

The input/output electrode P1 is connected to a first end of the coil conductor pattern 31 via the conductors 41, 42, and 43 and the interlayer connection conductors V1, V2, V3, and V4. A second end of the coil conductor pattern 31 is connected to a first end of the coil conductor pattern 32 via the interlayer connection conductor V5. A second end of the coil conductor pattern 32 is connected to a first end of the coil conductor pattern 33 via the interlayer connection conductor V6. A second end of the coil conductor pattern 33 is connected to a first end of the coil conductor pattern 34 via the interlayer connection conductor V7. A second end of the coil conductor pattern 34 is connected to the input/output electrode P2 via the interlayer connection conductor V8.

In this way, the coil 3 includes the coil conductor patterns 31, 32, 33, and 34 provided on the two or more resin layers 11, 12, 13, and 14, and the interlayer connection conductors V5, V6, and V7. As shown in FIG. 1B, the coil 3 has a winding axis AX in the Z-axis direction (stacking direction of the plurality of resin layers 11, 12, 13, 14, and 15).

As shown in FIG. 3, the total line width (W11+W12) of the plurality of linear conductor patterns LP11 and LP12 defining the parallel conductor portion PC1 is larger than the line width (W2) of the other portions of the coil conductor pattern 31 (W11+W12>W2). Further, as shown in FIG. 1B, the total line width (W11+W12) of the plurality of linear conductor patterns LP11 and LP12 is larger than a line width (W3) of each of the other coil conductor patterns 32, 33, and 34 (W11+W12>W3).

In the present preferred embodiment, each of the line widths (W11 and W12) of the plurality of linear conductor patterns LP11 and LP12 defining the parallel conductor portion PC1 is the same or substantially the same as the line width (W2) of the other portions of the coil conductor pattern 31. A gap (D1) between the plurality of linear conductor patterns LP11 and LP12 is the same or substantially the same as a gap (D2 or D3) between portions of the coil conductor pattern 31.

In the present preferred embodiment, as shown in FIG. 1B, the coil conductor pattern 31 including the parallel conductor portion PC1 is arranged closest to the surface layer in the Z-axis direction among the plurality of coil conductor patterns 31, 32, 33, and 34. The coil conductor pattern 31 is closest to the first main surface VS1 among the plurality of coil conductor patterns 31, 32, 33, and 34.

Figure 4A:
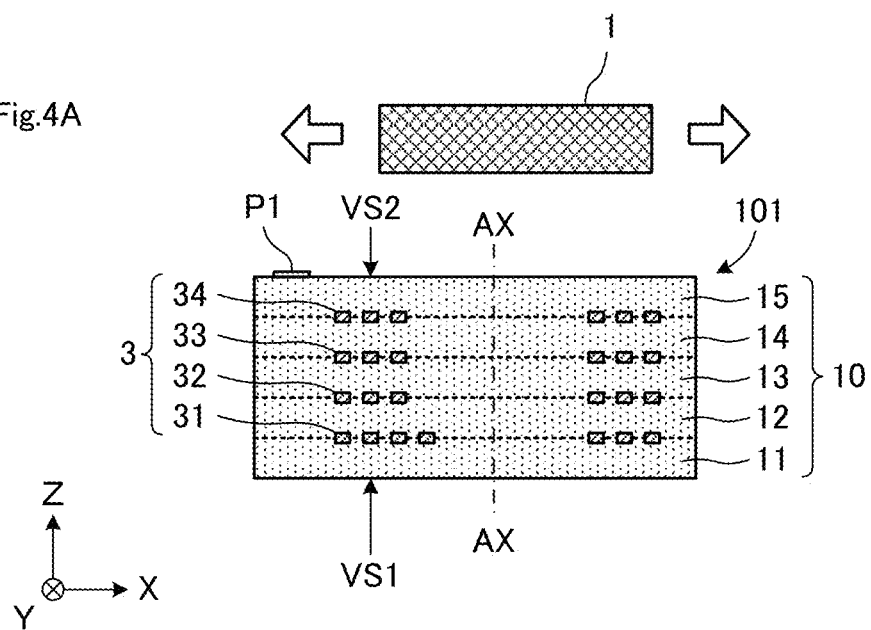
FIG. 4A is a sectional view showing a main portion of an actuator 201 according to the first preferred embodiment of the present invention.
Figure 4B:
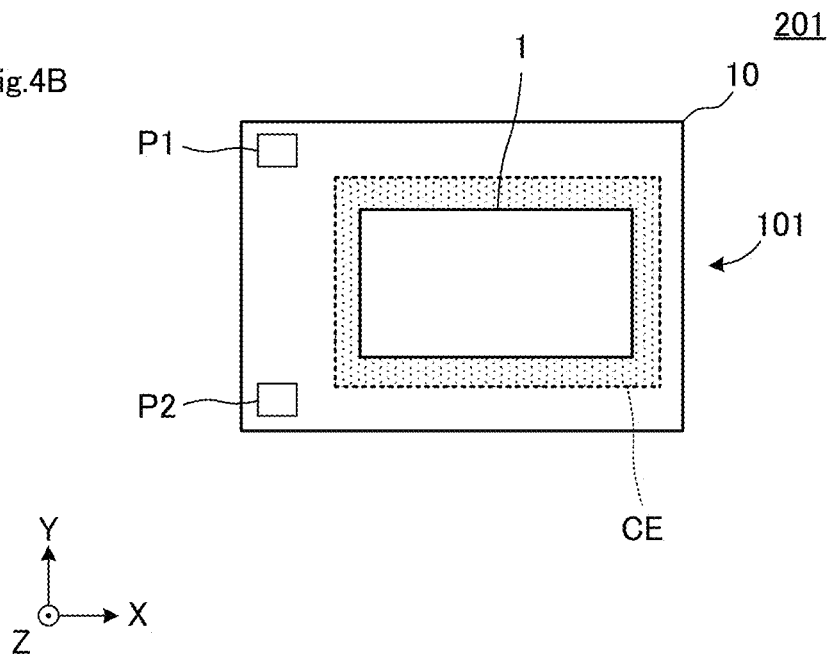
FIG. 4B is a plan view showing a main portion of the actuator 201.

The resin multilayer substrate 101 is used as follows, for example. FIG. 4A is a sectional view showing a main portion of an actuator 201 according to the first preferred embodiment, and FIG. 4B is a plan view showing a main portion of the actuator 201. In FIG. 4B, a formation region CE of the coil 3 is shown by a dot pattern.

The actuator 201 includes the resin multilayer substrate 101 and a magnet 1, and is incorporated in an electronic device (not shown) or the like. The magnet 1 is attached to a movable body (not shown). The magnet 1 is arranged at a position overlapping the formation region CE of the coil 3 when viewed in the Z-axis direction (winding axis direction of the coil 3). Further, as shown in FIG. 4A, the magnet 1 is arranged closer to the second main surface VS2 than to the first main surface VS1 of the stacked body 10. That is, the coil conductor pattern 31 including the parallel conductor portion is most distant from the magnet 1 among the plurality of coil conductor patterns 31, 32, 33, and 34.

When a predetermined current is passed through the coil 3, the magnetic field emitted from the coil 3 causes the magnet 1 and the movable body to be shifted in a direction (X-axis direction) orthogonal or substantially orthogonal to the Z-axis direction (stacking direction of the plurality of resin layers 11, 12, 13, 14, and 15) (see the white arrows in FIG. 4A).

The resin multilayer substrate 101 according to the present preferred embodiment is manufactured, for example, in the following steps. The actual manufacturing process of the resin multilayer substrate is performed in the state of a collective substrate, which is finally separated into individual pieces (one chip).

First, the plurality of resin layers 11, 12, 13, 14, and 15 in the state of the collective substrate are prepared. The plurality of resin layers 11, 12, 13, 14, and 15 are sheets whose main material is preferably, for example, liquid crystal polymer (LCP) or polyether ether ketone (PEEK).

After that, the coil conductor patterns 31, 32, 33, and 34, the input/output electrodes P1 and P2, and the conductors 41, 42, and 43 are formed on the plurality of resin layers 11, 12, 13, 14, and 15, respectively. Specifically, a metal foil (for example, Cu foil) is laminated on one main surface of each of the resin layers 11, 12, 13, 14, and 15 in the state of the collective substrate, and the metal foil is patterned by photolithography. Thus, the coil conductor pattern 31 is formed on the resin layer 11, the coil conductor pattern 32 and the conductor 41 are formed on the resin layer 12, the coil conductor pattern 33 and the conductor 42 are formed on the resin layer 13, the coil conductor pattern 34 and the conductor 43 are formed on the resin layer 14, and the input/output electrodes P1 and P2 are formed on the resin layer 15.

This step of forming the plurality of coil conductor patterns 31, 32, 33, and 34 on the two or more resin layers 11, 12, 13, and 14 is an example of the "coil conductor forming step".

The parallel conductor portion PC1 is provided in at least a portion of the outermost peripheral portion of the coil conductor pattern 31. The parallel conductor portion PC1 is a portion in which the plurality of linear conductor patterns LP11 and LP12 are connected in parallel to each other in parallel or substantially in parallel, and the total line width of the plurality of linear conductor patterns LP11 and LP12 is larger than the line width of the other portion of the coil conductor pattern 31.

The "coil conductor forming step" includes a step of forming the coil conductor pattern 31 in which the parallel conductor portion PC1 is provided at least at a portion of the outermost periphery.

In addition, the interlayer connection conductors V1, V2, V3, V4, V5, V6, V7, and V8 are formed on the plurality of resin layers 12, 13, 14, 15. The interlayer connection conductors V1, V2, V3, V4, V5, V6, V7, and V8 are provided by forming through holes by a laser or the like, for example, then arranging a conductive paste containing, for example, one or more of Cu, Sn etc. or an alloy thereof, and curing it by subsequent hot pressing.

Next, the resin layers 11, 12, 13, 14, and 15 are stacked in this order, and the plurality of stacked resin layers 11, 12, 13, 14, and 15 are subjected to hot pressing (collective press) to form the stacked body 10 in the state of the collective substrate.

This step of forming, after the "coil conductor forming step", the stacked body 10 by stacking the plurality of resin layers 11, 12, 13, 14, and 15 including the resin layers 11, 12, 13, and 14 on which the plurality of coil conductor patterns 31, 32, 33, and 34 are formed, and subjecting the plurality of stacked resin layers 11, 12, 13, 14, and 15 to hot pressing is an example of the "stacked body forming step".

Finally, the resin multilayer substrate 101 is obtained by separating the collective substrate into individual pieces.

The resin multilayer substrate 101 and the actuator 201 according to the present preferred embodiment have the following advantageous effects.

In the present preferred embodiment, the parallel conductor portion PC1 in which the plurality of linear conductor patterns LP11 and LP12 are connected in parallel to each other in parallel or substantially in parallel is provided in at least a portion of the outermost peripheral portion of the coil conductor pattern 31. Further, the total line width (Wa11+W12) of the plurality of linear conductor patterns LP11 and LP12 defining the parallel conductor portion PC1 is larger than the line width (W2) of the other portions of the coil conductor pattern 31 (W11+W12>W2). According to this configuration, the parallel conductor portion PC1 reduces or prevents the excessive flow of the resin at the time of hot pressing when forming the stacked body 10, and reduces the conductor loss of the coil 3.

If there are a plurality of coil conductor patterns with different line widths, the flow of the resin at the time of hot pressing may become irregular, with the result that positional deviation (or deformation) of the coil conductor patterns with narrow line widths may be caused. On the other hand, according to the above configuration, since the parallel conductor portion PC1 is provided in the coil conductor pattern 31, as compared to the case where a line width of one coil conductor pattern is increased without providing the parallel conductor portion, the regularity of the flow of the resin at the time of hot pressing is maintained. Therefore, the positional deviation of the coil conductor patterns at the time of hot pressing is further reduced or prevented.

In the present preferred embodiment, each of the line widths (W11 and W12) of the plurality of linear conductor patterns LP11 and LP12 defining the parallel conductor portion PC1 is the same or substantially the same as the line width (W2) of the other portions of the coil conductor pattern 31. The gap (D1) between the plurality of linear conductor patterns LP11 and LP12 is the same or substantially the same as the gap (D2 or D3) between portions of the coil conductor pattern 31. According to the above configuration, as compared to the case where a line width of one coil conductor pattern is increased without providing the parallel conductor portion, the regularity of the flow of the resin at the time of hot pressing is further maintained. Therefore, the positional deviation of the coil conductor patterns at the time of hot pressing is further reduced or prevented.

In the present preferred embodiment, the parallel conductor portion PC1 is provided over the entire or substantially the entire outermost peripheral portion of the coil conductor pattern 31. The outermost peripheral portion of the coil conductor pattern has a relatively larger conductor length than other portions (for example, the inner peripheral portion of the coil conductor pattern). Therefore, by providing the parallel conductor portion PC1 over the entire or substantially the entire outermost peripheral portion of the coil conductor pattern 31, the conductor loss of the coil 3 can be significantly reduced.

In the present preferred embodiment, the coil conductor pattern 31 including the parallel conductor portion PC1 is arranged closest to the surface layer in the Z-axis direction among the plurality of coil conductor patterns 31, 32, 33, and 34. When a stacked body is formed by subjecting the plurality of stacked resin layers 11, 12, 13, 14, and 15 to hot pressing, the portion near the surface layer of the stacked body 10 is particularly susceptible to heat of a pressing machine at the time of hot pressing, and the coil conductor pattern arranged near the surface layer of the stacked body 10 is likely to be positionally deviated. Therefore, by arranging the coil conductor pattern 31 having the parallel conductor portion PC1 closest to the surface layer, the positional deviation of the coil conductor patterns at the time of hot pressing can be effectively reduced or prevented.

In the actuator 201 according to the present preferred embodiment, the coil conductor pattern 31 provided with the parallel conductor portion PC1 is closest to the first main surface VS1 among the plurality of coil conductor patterns 31, 32, 33, and 34, and the magnet 1 is arranged closer to the second main surface VS2 than to the first main surface VS1. The number of turns per unit area of the coil conductor pattern including the parallel conductor portion is smaller than that of other coil conductor patterns. Generally, when the number of turns of the coil conductor pattern is large, the magnetic flux density generated around the coil conductor pattern is higher. Therefore, by arranging the coil conductor pattern including the parallel conductor portion at a position farther from the magnet than the other coil conductor patterns, it is possible to reduce or prevent the conductor loss of the coil while reducing or preventing the reduction of the electromagnetic force due to the interaction between the magnet 1 and the coil 3.

Second Preferred Embodiment

A second preferred embodiment of the present invention shows an example in which a plurality of coil conductor patterns including a parallel conductor portion are provided.

Figure 5A:
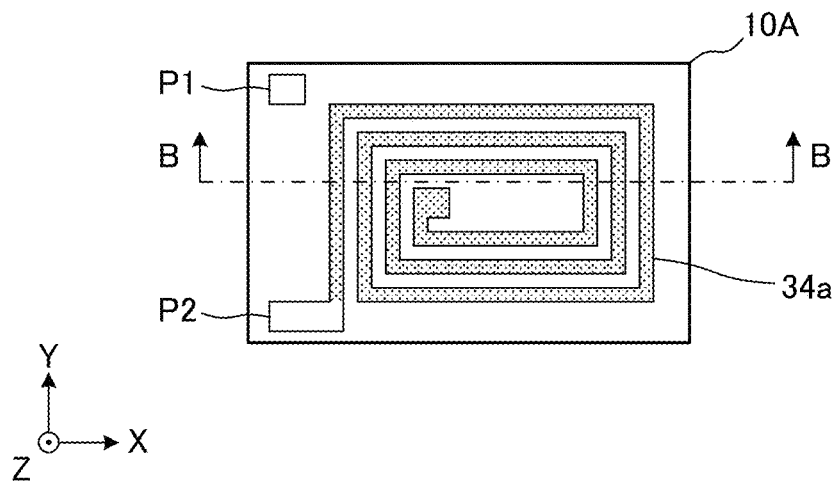
FIG. 5A is a plan view of a resin multilayer substrate 102 according to a second preferred embodiment of the present invention.
Figure 5B:
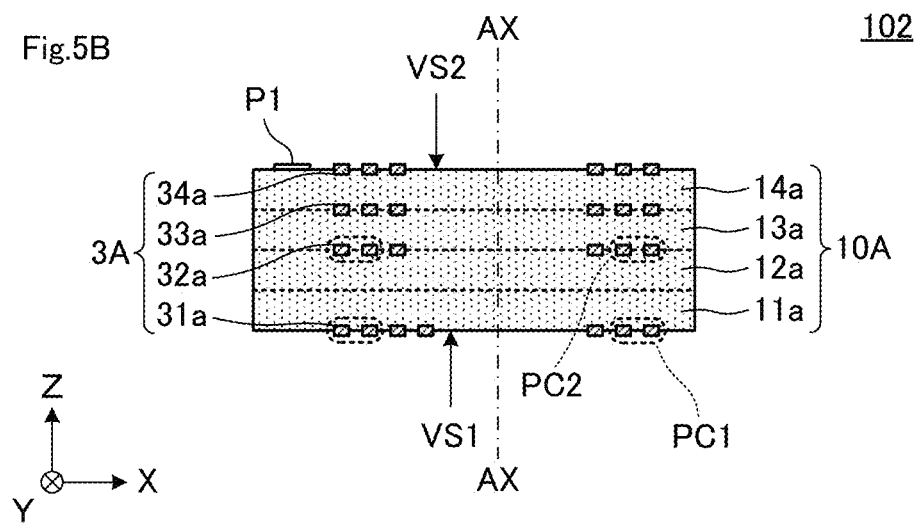
FIG. 5B is a sectional view taken along line B-B in FIG. 5A.
Figure 6:
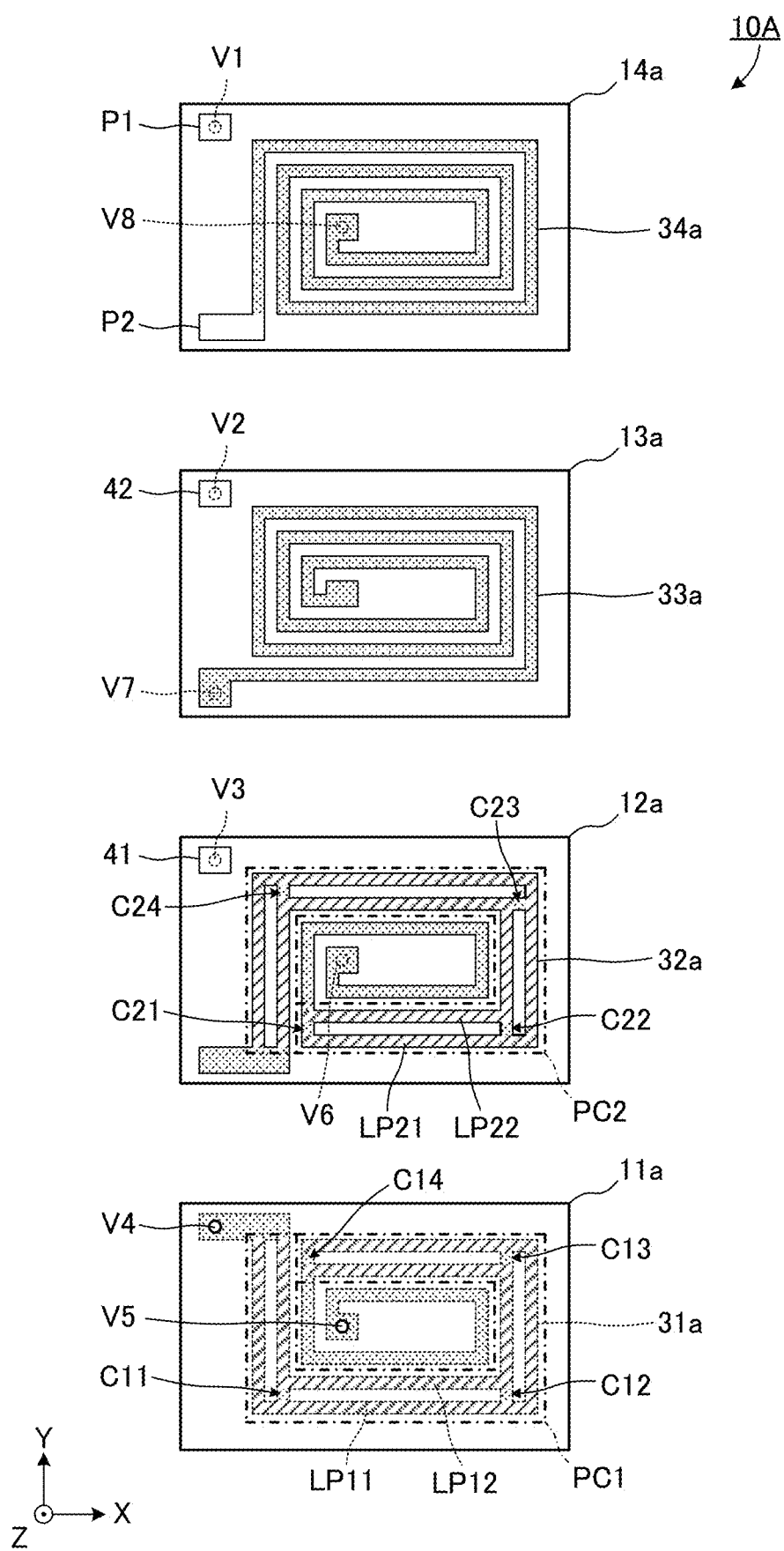
FIG. 6 is an exploded plan view of a stacked body 10A included in the resin multilayer substrate 102.

FIG. 5A is a plan view of the resin multilayer substrate 102 according to the second preferred embodiment, and FIG. 5B is a sectional view taken along line B-B in FIG. 5A. FIG. 6 is an exploded plan view of a stacked body 10A included in the resin multilayer substrate 102. In FIG. 5A and FIG. 6, coil conductor patterns 31a, 32a, 33a, and 34a are shown by dot patterns in order to make the structure easy to understand. Further, in FIG. 6, linear conductor patterns LP11, LP12, LP21, and LP22 are shown by hatching.

The resin multilayer substrate 102 is different from the resin multilayer substrate 101 according to the first preferred embodiment in that the resin multilayer substrate 102 includes the stacked body 10A and a coil 3A. Other elements and configurations of the resin multilayer substrate 102 are the same or substantially the same as those of the resin multilayer substrate 101.

Hereinafter, portions different from the resin multilayer substrate 101 according to the first preferred embodiment will be described.

The stacked body 10A includes a plurality of resin layers 11a, 12a, 13a, and 14a made of, for example, a thermoplastic resin, and stacked in this order. The plurality of resin layers 11a, 12a, 13a, and 14a are the same or substantially the same as the resin layers 11, 12, 13, and 14 described in the first preferred embodiment.

The coil conductor pattern 31a is provided on the back surface of the resin layer 11a. The shape of the coil conductor pattern 31a is the same or substantially the same as that of the coil conductor pattern 31 described in the first preferred embodiment. The coil conductor pattern 31a is provided with a parallel conductor portion PC1 of about 1 turn over the entire or substantially the entire outermost peripheral portion. In addition, interlayer connection conductors V4 and V5 are provided on the resin layer 11a.

The coil conductor pattern 32a and a conductor 41 are provided on the front surface of the resin layer 12a. The coil conductor pattern 32a is a spiral conductor pattern arranged near the center of the resin layer 12a. The coil conductor pattern 32a is provided with a parallel conductor portion PC2 of, for example, about 1 turn over the entire or substantially the entire outermost peripheral portion. The parallel conductor portion PC2 is a portion where the plurality of linear conductor patterns LP21 and LP22 connected in parallel are parallel or substantially parallel to each other. The plurality of linear conductor patterns LP21 and LP22 are connected to each other in parallel by connecting portions C21, C22, C23, and C24. The shape of the conductor 41 is the same or substantially the same as the conductor 41 described in the first preferred embodiment. In addition, interlayer connection conductors V3 and V6 are provided on the resin layer 12a.

The coil conductor pattern 33a and a conductor 42 are provided on the front surface of the resin layer 13a. The coil conductor pattern 33a and the conductor 42 are the same or substantially the same as the coil conductor pattern 33 and the conductor 42 according to the first preferred embodiment, respectively. In addition, interlayer connection conductors V2 and V7 are provided on the resin layer 13a.

The coil conductor pattern 34a and input/output electrodes P1 and P2 are provided on the front surface of the resin layer 14a. The coil conductor pattern 34a is a spiral conductor pattern arranged near the center of the resin layer 14a. The input/output electrode P1 is a rectangular or substantially rectangular conductor pattern arranged near a first corner of the resin layer 14a (upper left corner of the resin layer 14a in FIG. 6). The input/output electrode P2 is a rectangular or substantially rectangular conductor pattern arranged near a second corner of the resin layer 14a (lower left corner of the resin layer 14a in FIG. 6). In addition, interlayer connection conductors V1 and V8 are provided on the resin layer 14a.

The input/output electrode P1 is connected to a first end of the coil conductor pattern 31a via the conductors 41 and 42 and the interlayer connection conductors V1, V2, V3, and V4. A second end of the coil conductor pattern 31a is connected to a first end of the coil conductor pattern 32a via the interlayer connection conductors V5 and V6. A second end of the coil conductor pattern 32a is connected to a first end of the coil conductor pattern 33a via the interlayer connection conductor V7. A second end of the coil conductor pattern 33a is connected to a first end of the coil conductor pattern 34a via the interlayer connection conductor V8. A second end of the coil conductor pattern 34a is connected to the input/output electrode P2.

In this way, the coil 3A includes the coil conductor patterns 31a, 32a, 33a, and 34a provided on the two or more resin layers 11a, 12a, 13a, and 14a, and the interlayer connection conductors V5, V6, V7, and V8.

The resin multilayer substrate 102 according to the present preferred embodiment has the following advantageous effects in addition to the advantageous effects described in the first preferred embodiment.

In present preferred embodiment, since a plurality of coil conductor patterns including a parallel conductor portion are provided, the conductor loss of the coil 3A is further reduced, and the effect of reducing or preventing the positional deviation of the coil conductor patterns is further improved.

Third Preferred Embodiment

A third preferred embodiment of the present invention shows an example in which a plurality of coil conductor patterns including a parallel conductor portion are arranged closest to the surface layers in the stacking direction of a plurality of resin layers.

Figure 7A:
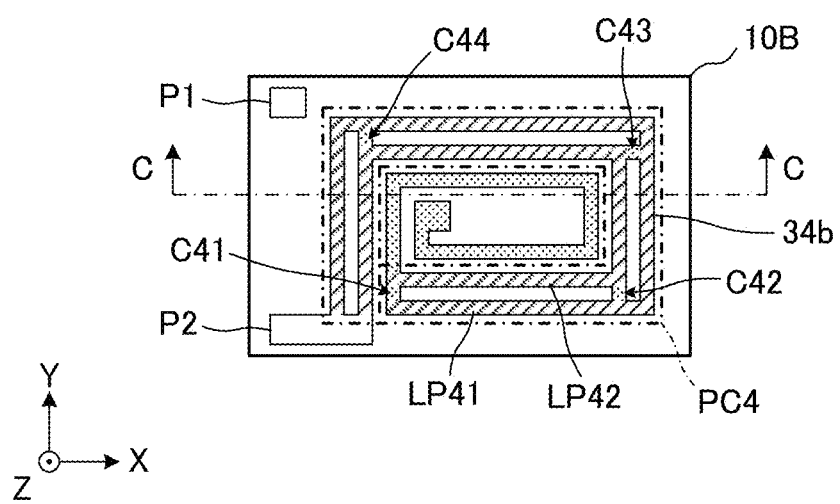
FIG. 7A is a plan view of a resin multilayer substrate 103 according to a third preferred embodiment of the present invention.
Figure 7B:
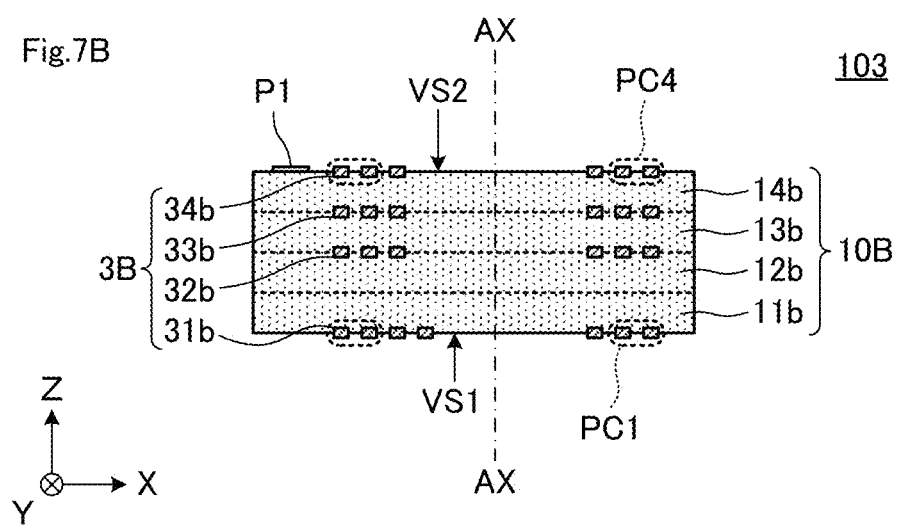
FIG. 7B is a sectional view taken along line C-C in FIG. 7A.
Figure 8:
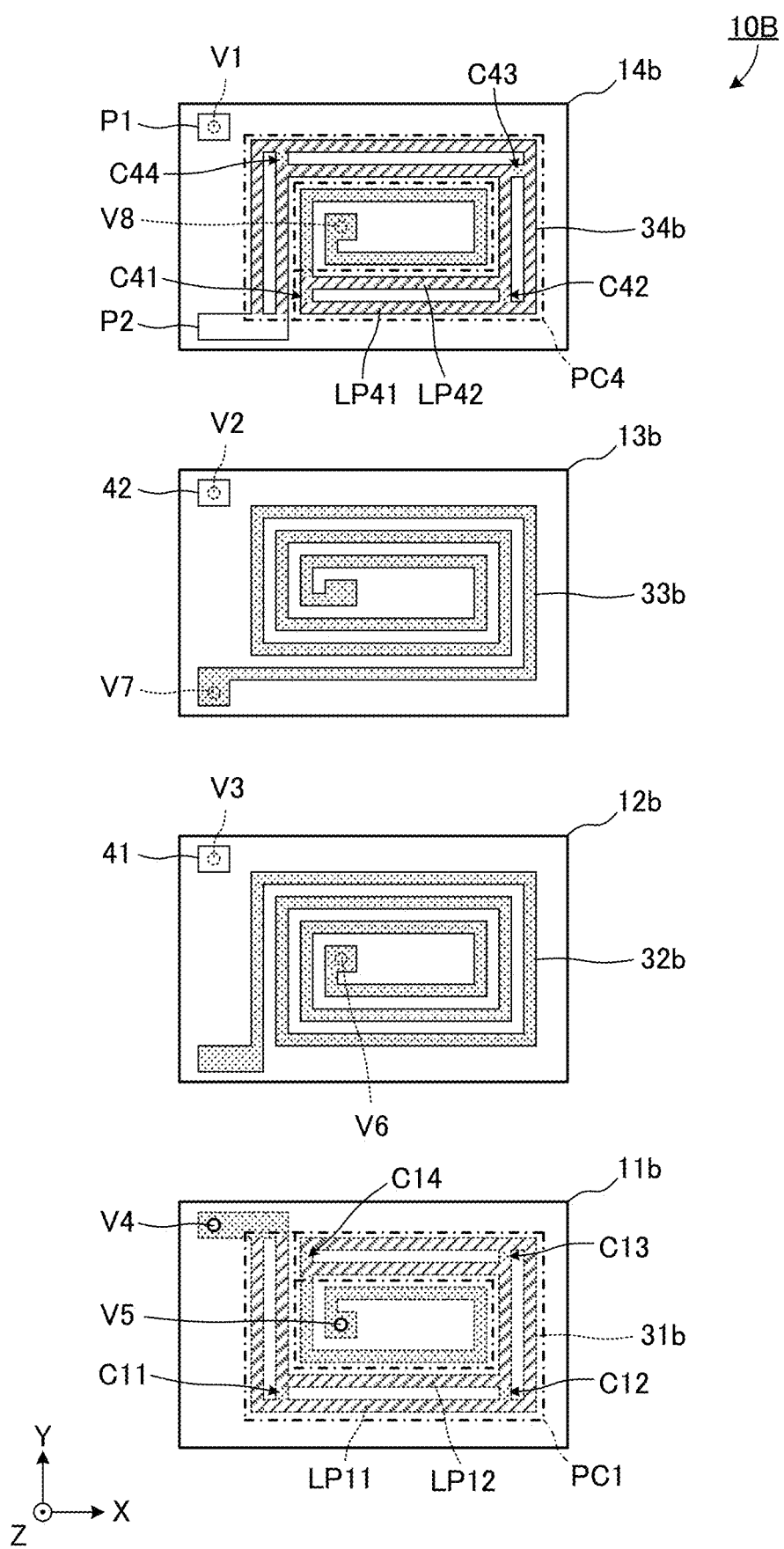
FIG. 8 is an exploded plan view of a stacked body 10B included in the resin multilayer substrate 103.

FIG. 7A is a plan view of a resin multilayer substrate 103 according to the third preferred embodiment, and FIG. 7B is a sectional view taken along line C-C in FIG. 7A. FIG. 8 is an exploded plan view of a stacked body 10B included in the resin multilayer substrate 103. In FIG. 7A and FIG. 8, coil conductor patterns 31b, 32b, 33b, and 34b are shown by dot patterns in order to make the structure easy to understand. Further, in FIG. 7A and FIG. 8, linear conductor patterns LP11, LP12, LP41, and LP42 are shown by hatching.

The resin multilayer substrate 103 is different from the resin multilayer substrate 102 according to the second preferred embodiment in that the resin multilayer substrate 103 includes the stacked body 10B and a coil 3B. Other elements and configurations of the resin multilayer substrate 103 are the same or substantially the same as those of the resin multilayer substrate 102.

Hereinafter, portions different from the resin multilayer substrate 102 according to the second preferred embodiment will be described.

The stacked body 10B includes a plurality of resin layers 11b, 12b, 13b, and 14b made of a thermoplastic resin that are stacked in this order. The plurality of resin layers 11b, 12b, 13b, and 14b are the same or substantially the same as the resin layers 11a, 12a, 13a, and 14a of the second preferred embodiment.

The coil conductor pattern 31b is provided on the back surface of the resin layer 11b. The coil conductor pattern 31b is the same or substantially the same as the coil conductor pattern 31a described in the second preferred embodiment. The coil conductor pattern 31b is provided with a parallel conductor portion PC1 of, for example, about 1 turn over the entire or substantially the entire outermost peripheral portion. Further, interlayer connection conductors V4 and V5 are provided on the resin layer 11b.

The coil conductor pattern 32b and a conductor 41 are provided on the front surface of the resin layer 12b. The coil conductor pattern 32b is a spiral conductor pattern arranged near the center of the resin layer 12b. The conductor 41 is the same or substantially the same as the conductor 41 described in the second preferred embodiment. Further, interlayer connection conductors V3 and V6 are provided on the resin layer 12b.

The coil conductor pattern 33b and a conductor 42 are provided on the front surface of the resin layer 13b. The coil conductor pattern 33b and the conductor 42 are the same or substantially the same as the coil conductor pattern 33a and the conductor 42 described in the second preferred embodiment, respectively. Further, interlayer connection conductors V2 and V7 are provided on the resin layer 13b.

The coil conductor pattern 34b and input/output electrodes P1 and P2 are provided on the front surface of the resin layer 14b. The coil conductor pattern 34b is a spiral conductor pattern arranged near the center of the resin layer 14b. The coil conductor pattern 34b is provided with a parallel conductor portion PC4 of, for example, about 1 turn over the entire or substantially the entire outermost peripheral portion. The parallel conductor portion PC4 is a portion where the plurality of linear conductor patterns LP41 and LP42 connected in parallel are parallel or substantially parallel to each other. The plurality of linear conductor patterns LP41 and LP42 are connected to each other in parallel by connecting portions C41, C42, C43, and C44. The input/output electrode P1 is a rectangular or substantially rectangular conductor pattern arranged near a first corner of the resin layer 14b (upper left corner of the resin layer 14b in FIG. 8). The input/output electrode P2 is a rectangular or substantially rectangular conductor pattern arranged near a second corner of the resin layer 14b (lower left corner of the resin layer 14b in FIG. 8). Further, interlayer connection conductors V1 and V8 are provided on the resin layer 14b.

The input/output electrode P1 is connected to a first end of the coil conductor pattern 31b via the conductors 41 and 42 and the interlayer connection conductors V1, V2, V3, and V4. A second end of the coil conductor pattern 31b is connected to a first end of the coil conductor pattern 32b via the interlayer connection conductors V5 and V6. A second end of the coil conductor pattern 32b is connected to a first end of the coil conductor pattern 33b via the interlayer connection conductor V7. A second end of the coil conductor pattern 33b is connected to a first end of the coil conductor pattern 34b via the interlayer connection conductor V8. A second end of the coil conductor pattern 34b is connected to the input/output electrode P2.

Thus, the coil 3B includes the coil conductor patterns 31b, 32b, 33b, and 34b provided on the two or more resin layers 11b, 12b, 13b, and 14b, and the interlayer connection conductors V5, V6, V7, and V8.

In the present preferred embodiment, as shown in FIG. 7B, the coil conductor pattern 31b including the parallel conductor portion is arranged at a position closest to the first main surface VS1 among the plurality of coil conductor patterns 31b, 32b, 33b, and 34b. Further, in the present preferred embodiment, the coil conductor pattern 34b including the parallel conductor portion is arranged at the position closest to the second main surface VS2 among the plurality of coil conductor patterns 31b, 32b, 33b, and 34b. Specifically, the coil conductor pattern 31b is provided on the first main surface VS1 of the stacked body 10B, and the coil conductor pattern 34b is provided on the second main surface VS2 of the stacked body 10B.

It should be noted that the coil conductor pattern including the parallel conductor portion is "arranged at the position closest to the first main surface" means that the coil conductor pattern including the parallel conductor portion is arranged closer to the first main surface VS1 than to the second main surface VS2, and is arranged closest to the first main surface VS1 among the plurality of coil conductor patterns. Further, it should be noted that the coil conductor pattern including the parallel conductor portion is "arranged at the position closest to the second main surface" means that the coil conductor pattern including the parallel conductor portion is arranged closer to the second main surface VS2 than to the first main surface VS1, and is arranged closest to the second main surface VS2 among the plurality of coil conductor patterns.

The resin multilayer substrate 103 according to the present preferred embodiment has the following advantageous effects in addition to the advantageous effects described in the second preferred embodiment.

In the present preferred embodiment, the plurality of coil conductor patterns 31b and 34b including the parallel conductor portion are arranged at the position closest to the first main surface VS1 and the position closest to the second main surface VS2, respectively, among the plurality of coil conductor patterns 31b, 32b, 33b, and 34b. According to this configuration, it is possible to effectively reduce or prevent positional deviation (or deformation) of the two coil conductor patterns arranged at the positions closer to both the main surfaces (first main surface VS1 and second main surface VS2) of the stacked body that are susceptible to heat of the pressing machine at the time of hot pressing.

Fourth Preferred Embodiment

A fourth preferred embodiment of the present invention shows an example in which a configuration of a coil conductor pattern including a parallel conductor portion is different from that of each of the above-described preferred embodiments.

Figure 9A:
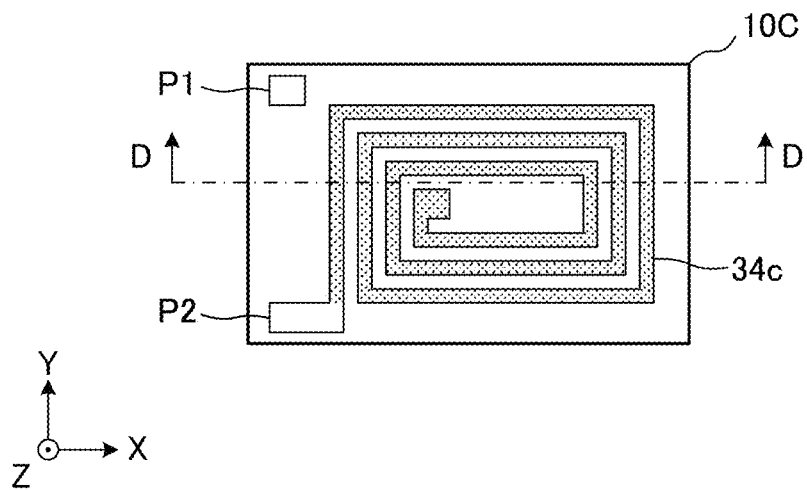
FIG. 9A is a plan view of a resin multilayer substrate 104 according to a fourth preferred embodiment of the present invention.
Figure 9B:
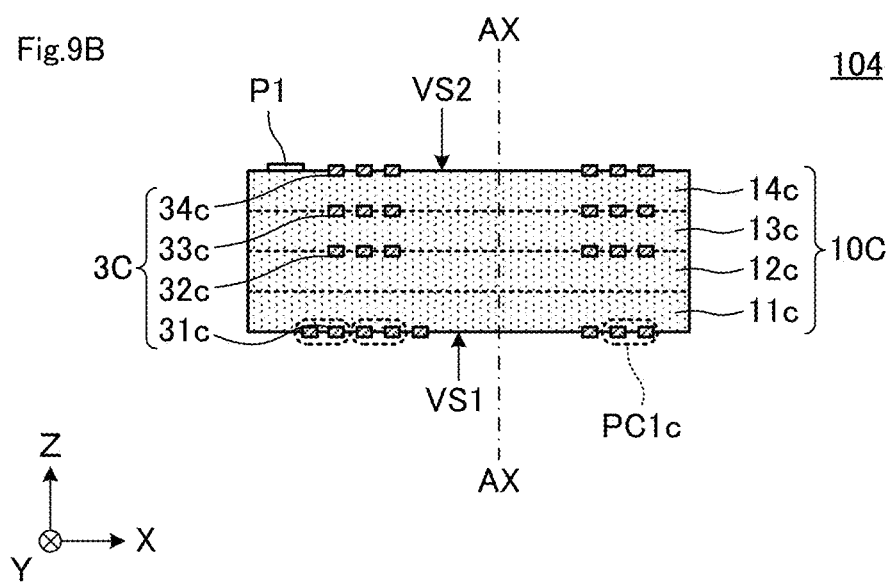
FIG. 9B is a sectional view taken along line D-D in FIG. 9A.
Figure 11:
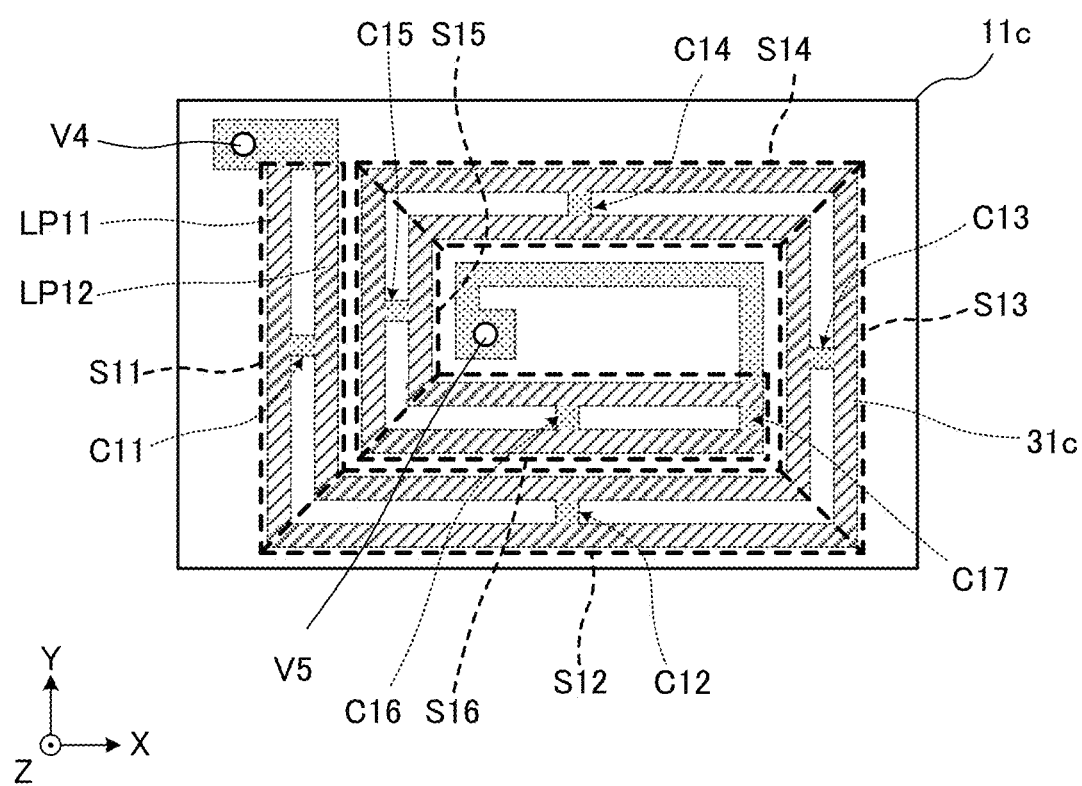
FIG. 11 is an enlarged plan view of a resin layer 11c defining a portion of the stacked body 10C.

FIG. 9A is a plan view of a resin multilayer substrate 104 according to the fourth preferred embodiment, and FIG. 9B is a sectional view taken along line D-D in FIG. 9A. FIG. 10 is an exploded plan view of a stacked body 10C included in the resin multilayer substrate 104. FIG. 11 is an enlarged plan view of a resin layer 11c forming a portion of the stacked body 10C. In FIG. 9A, FIG. 10, and FIG. 11, coil conductor patterns 31c, 32c, 33c, and 34c are shown by dot patterns in order to make the structure easy to understand.

Further, in FIG. 9A, FIG. 10, and FIG. 11, linear conductor patterns LP11 and LP12 are shown by hatching.

The resin multilayer substrate 104 is different from the resin multilayer substrate 102 according to the second preferred embodiment in that the resin multilayer substrate 104 includes the stacked body 10C and a coil 3C. Other elements and configurations of the resin multilayer substrate 104 are the same or substantially the same as those of the resin multilayer substrate 102.

Hereinafter, portions different from the resin multilayer substrate 102 according to the second preferred embodiment will be described.

The stacked body 10C includes a plurality of resin layers 11c, 12c, 13c, and 14c made of, for example, a thermoplastic resin, and stacked in this order. The plurality of resin layers 11c, 12c, 13c, and 14c are the same or substantially the same as the resin layers 11a, 12a, 13a, and 14a according to the second preferred embodiment.

The coil conductor pattern 31c is provided on the back surface of the resin layer 11c. The coil conductor pattern 31c is a spiral conductor pattern arranged near the center of the resin layer 11c. The coil conductor pattern 31c is provided with a parallel conductor portion PC1c of, for example, about 1.5 turns from the outermost peripheral portion to the inner peripheral portion. The parallel conductor portion PC1c is a portion where the plurality of linear conductor patterns LP11 and LP12 connected in parallel are parallel or substantially parallel to each other. As shown in FIG. 11, the parallel conductor portion PC1c includes straight portions S11, S12, S13, S14, S15, and S16 and connecting portions C11, C12, C13, C14, C15, C16, and C17. The straight portions S11 to S16 are portions where a plurality of linear conductor patterns LP11 and LP12 are linearly parallel or substantially parallel to each other. The plurality of linear conductor patterns LP11 and LP12 are connected to each other in parallel by the connecting portions C11 to C17. The connecting portions C11 to C16 are portions that connect the plurality of linear conductor patterns LP11 and LP12 to each other near the centers of the straight portions S11 to S16.

It should be noted that "near the centers of the straight portions" does not mean only the vicinities of the centers of the straight portions S11 to S16. "Near the centers of the straight portions" means, for example, ranges of lengths from the centers of the straight portions S11 to S16 to about ¼ of the total lengths of the straight portions S11 to S16 toward the extending direction of the linear conductor patterns.

Further, interlayer connection conductors V4 and V5 are provided on the resin layer 11c.

The coil conductor pattern 32c and a conductor 41 are provided on the front surface of the resin layer 12c. The coil conductor pattern 32c is a spiral conductor pattern arranged near the center of the resin layer 12c, and the conductor 41 is a rectangular or substantially rectangular conductor pattern arranged near a first corner of the resin layer 12c (upper left corner of the resin layer 12c in FIG. 2).

The coil conductor pattern 33c and a conductor 42 are provided on the front surface of the resin layer 13c. The coil conductor pattern 33c and the conductor 42 are the same or substantially the same as the coil conductor pattern 33a and the conductor 42 described in the second preferred embodiment, respectively. Further, interlayer connection conductors V2 and V7 are provided on the resin layer 13c.

The coil conductor pattern 34c and input/output electrodes P1 and P2 are provided on the front surface of the resin layer 14c. The coil conductor pattern 34c and the input/output electrodes P1 and P2 are the same or substantially the same as the coil conductor pattern 34a and the input/output electrodes P1 and P2 described in the second preferred embodiment. Further, interlayer connection conductors V1 and V8 are provided on the resin layer 14c.

The input/output electrode P1 is connected to a first end of the coil conductor pattern 31c via the conductors 41 and 42 and the interlayer connection conductors V1, V2, V3, and V4. A second end of the coil conductor pattern 31c is connected to a first end of the coil conductor pattern 32c via the interlayer connection conductors V5 and V6. A second end of the coil conductor pattern 32c is connected to a first end of the coil conductor pattern 33c via the interlayer connection conductor V7. A second end of the coil conductor pattern 33c is connected to a first end of the coil conductor pattern 34c via the interlayer connection conductor V8. A second end of the coil conductor pattern 34c is connected to the input/output electrode P2.

Thus, the coil 3C includes the coil conductor patterns 31c, 32c, 33c, and 34c provided on the two or more resin layers 11c, 12c, 13c, and 14c, and the interlayer connection conductors V5, V6, V7, and V8.

As described in present preferred embodiment, the parallel conductor portions may have one or more turns. The conductor loss of the coil can be further reduced by making the parallel conductor portions one turn or more. Moreover, the parallel conductor portion may be provided in a portion other than the outermost peripheral portion of the coil conductor pattern.

Figure 12:
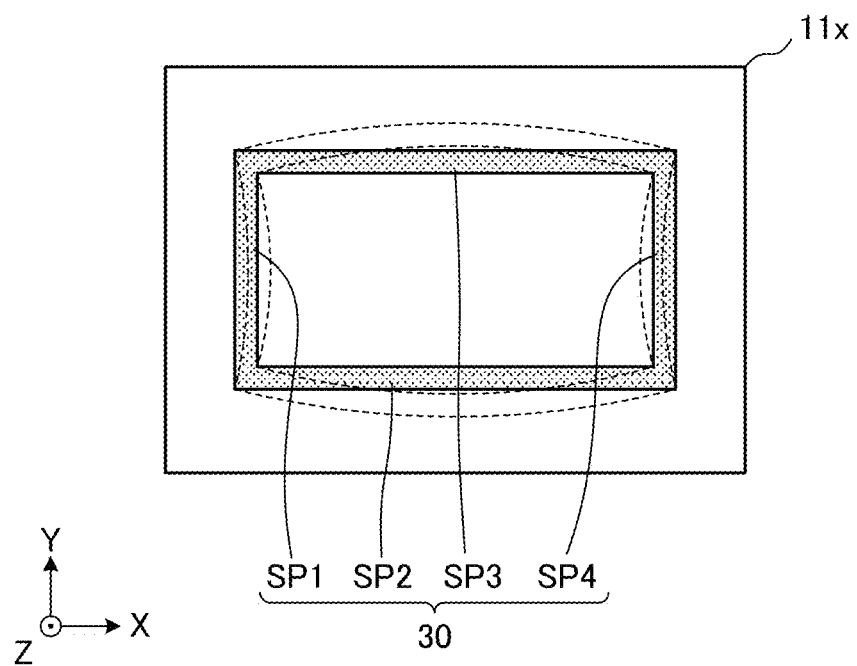
FIG. 12 is a plan view of a resin layer 11x defining a portion of a stacked body.

Next, the advantages of connecting a plurality of linear conductor patterns to each other near centers of straight portions will be described with reference to the drawings. FIG. 12 is a plan view of a resin layer 11x defining a portion of a stacked body.

An annular conductor pattern 30 having a rectangular or substantially rectangular outer shape is provided on the front surface of the resin layer 11x. As shown in FIG. 12, the conductor pattern 30 includes four linear pattern portions SP1, SP2, SP3, and SP4 that linearly extend. A plurality of resin layers including the resin layer 11x are stacked, and the plurality of stacked resin layers are subjected to hot pressing to form the stacked body.

When the plurality of resin layers are subjected to hot pressing to form the stacked body, the annular conductor pattern 30 having a rectangular outer shape is deformed into a shape shown by the broken line in FIG. 12, for example. Long straight line pattern portions (or narrow straight line pattern portions) are likely to be deformed (or positionally deviated) due to the flow of the resin at the time of hot pressing. In particular, the portions near the centers of the straight pattern portions SP1, SP2, SP3, and SP4 of the conductor pattern 30 are more likely to be deformed than the corner portions of the conductor pattern 30.

That is, the long straight portions in which the plurality of linear conductor patterns are linearly parallel or substantially parallel to each other are likely to be deformed (or positionally deviated) due to the flow of resin at the time of hot pressing. Therefore, when the straight portions are provided in the coil conductor pattern, problems such as a characteristics change of the coil or a short circuit are likely to occur after the stacked body is formed (after hot pressing). On the other hand, in the present preferred embodiment, by connecting the portions near the centers of the straight portions to each other, it is possible to effectively reduce or prevent the deformation of the straight portions due to the flow of the resin at the time of hot pressing. Therefore, it is possible to effectively reduce or prevent the occurrence of a characteristic change of the coil or a short circuit due to the deformation of the straight portions.

Each of the preferred embodiments described above shows an example in which the stacked body is a rectangular or substantially rectangular parallelepiped, but the present invention is not limited to this configuration. The shape of the stacked body can be appropriately changed within the range where the action and advantageous effects of the present invention are obtained, and may be, for example, a cube, a polygonal column, a cylinder, an elliptic column, or the like, and the plane shape of the stacked body may be an L-shape, a crank shape, a T-shape, or a Y-shape, for example.

Further, each of the preferred embodiments described above shows an example of the resin multilayer substrate including the stacked body including four or five resin layers that are stacked, but the resin multilayer substrate of the present invention is not limited to this. The number of resin layers in the stacked body can be appropriately changed within the range where the action and advantageous effects of the present invention are obtained. Further, a protective layer, such as, for example, a coverlay film or a solder resist film may be provided on the first main surface VS1 or the second main surface VS2 of the stacked body.

Each of the preferred embodiments described above shows an example in which the stacked body includes a plurality of resin layers made of a thermoplastic resin that are stacked, but the present invention is not limited to this configuration. The stacked body may have a configuration in which a plurality of resin layers made of, for example, a thermosetting resin are stacked.

The shape and the number of turns of the coil of the present invention are not limited to the configurations of the preferred embodiments described above, and can be changed as appropriate within the range where the action and advantageous effects of the present invention are obtained.

The preferred embodiments show examples of the coil having the winding axis AX in the stacking direction of the plurality of resin layers (Z-axis direction), but the present invention is not limited to the case where the stacking direction (Z-axis direction) and the winding axis of the coil exactly coincide with each other. In the present invention, "having the winding axis in the stacking direction of the plurality of resin layers" includes, for example, a case where the winding axis of the coil is in the range of about −45° to about +45° with respect to the stacking direction (Z-axis direction).

Each of the preferred embodiments described above shows an example in which the parallel conductor portion is a portion where two linear conductor patterns connected in parallel are parallel or substantially parallel, but the parallel conductor portion in the present invention is not limited to this configuration. The parallel conductor portion may be, for example, a portion where three or more linear conductor patterns connected in parallel are parallel or substantially parallel to each other.

Furthermore, each of the preferred embodiments described above shows an example in which one parallel conductor portion is provided in one coil conductor pattern, and the present invention is not limited to this configuration. A plurality of parallel conductor portions may be provided in one coil conductor pattern.

Each of the preferred embodiments described above shows an example in which the rectangular or substantially rectangular input/output electrodes P1 and P2 are provided on the second main surface VS2 of the stacked body, but the present invention is not limited to this configuration. The shape, the number, and the position of the input/output electrodes can be changed as appropriate within the range where the action and advantageous effects of the present invention are obtained. The number of input/output electrodes can be appropriately changed depending on the circuit configuration of the resin multilayer substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a stacked body including a plurality of resin layers that are stacked; and
   a coil including a plurality of coil conductor patterns provided on two or more resin layers of the plurality of resin layers; wherein
   the plurality of coil conductor patterns include a coil conductor pattern including a parallel conductor portion in which a plurality of linear conductor patterns connected in parallel are parallel or substantially parallel to each other in at least a portion of an outermost peripheral portion; and
   a total line width of the plurality of linear conductor patterns defining the parallel conductor portion is larger than a line width of other portions of the coil conductor pattern.

2. The resin multilayer substrate according to claim 1, wherein the parallel conductor portion is provided on an entirety or substantially an entirety of the outermost peripheral portion of the coil conductor pattern.

3. The resin multilayer substrate according to claim 1, wherein the parallel conductor portion includes a straight portion in which the plurality of linear conductor patterns are linearly parallel or substantially parallel to each other, and a connecting portion that connects the linear conductor patterns to each other near a center of the straight portion.

4. The resin multilayer substrate according to claim 1, wherein the coil conductor pattern including the parallel conductor portion is closest to a surface layer in a stacking direction of the plurality of resin layers among the plurality of coil conductor patterns.

5. The resin multilayer substrate according to claim 1, wherein
   the stacked body includes a first main surface and a second main surface that oppose each other in a stacking direction of the plurality of resin layers; and
   the coil conductor pattern including the parallel conductor portion is closest to the first main surface among the plurality of coil conductor patterns.

6. The resin multilayer substrate according to claim 1, wherein a plurality of the coil conductor patterns including the parallel conductor portion are provided.

7. The resin multilayer substrate according to claim 6, wherein
   the stacked body includes a first main surface and a second main surface that oppose each other in a stacking direction of the plurality of resin layers; and
   the plurality of the coil conductor patterns including the parallel conductor portion are at a position closest to the first main surface and a position closest to the second main surface, respectively, among the plurality of coil conductor patterns.

8. An actuator comprising:
   the resin multilayer substrate according to claim 5; and
   a magnet; wherein
   the coil has a winding axis in the stacking direction; and
   the magnet overlaps a formation region of the coil when viewed in a winding axis direction of the coil, and is closer to the second main surface than to the first main surface.

9. The actuator according to claim 8, wherein the parallel conductor portion is provided on an entirety or substantially an entirety of the outermost peripheral portion of the coil conductor pattern.

10. The actuator according to claim 8, wherein the parallel conductor portion includes a straight portion in which the plurality of linear conductor patterns are linearly parallel or substantially parallel to each other, and a connecting portion that connects the linear conductor patterns to each other near a center of the straight portion.

11. An actuator comprising:
    the resin multilayer substrate according to claim 7; and
    a magnet; wherein
    the coil has a winding axis in the stacking direction; and
    the magnet overlaps a formation region of the coil when viewed in a winding axis direction of the coil, and is closer to the second main surface than to the first main surface.

12. The actuator according to claim 11, wherein the parallel conductor portion is provided on an entirety or substantially an entirety of the outermost peripheral portion of the coil conductor pattern.

13. The actuator according to claim 11, wherein the parallel conductor portion includes a straight portion in which the plurality of linear conductor patterns are linearly parallel or substantially parallel to each other, and a connecting portion that connects the linear conductor patterns to each other near a center of the straight portion.

14. A method of manufacturing a resin multilayer substrate comprising:
    a coil conductor forming step of forming a plurality of coil conductor patterns on two or more resin layers; and
    a stacked body forming step of stacking, after the coil conductor forming step, a plurality of the resin layers including the two or more resin layers on which the plurality of coil conductor patterns are formed, and subjecting the plurality of stacked resin layers to hot pressing to form a stacked body; wherein
    the coil conductor forming step includes a step of forming a coil conductor pattern including a parallel conductor portion in which a plurality of linear conductor patterns connected in parallel to each other are in parallel or substantially in parallel in at least a portion of an outermost peripheral portion, and a total line width of the plurality of linear conductor patterns is larger than a line width of other portions of the coil conductor pattern.

15. The method of manufacturing a resin multilayer substrate according to claim 14, wherein the parallel conductor portion is formed on an entirety or substantially an entirety of the outermost peripheral portion of the coil conductor pattern.

16. The method of manufacturing a resin multilayer substrate according to claim 14, wherein the parallel conductor portion includes a straight portion in which the plurality of linear conductor patterns are linearly parallel or substantially parallel to each other, and a connecting portion that connects the linear conductor patterns to each other near a center of the straight portion.

17. The method of manufacturing a resin multilayer substrate according to claim 14, wherein the coil conductor pattern including the parallel conductor portion is formed closest to a surface layer in a stacking direction of the plurality of resin layers among the plurality of coil conductor patterns.

18. The method of manufacturing a resin multilayer substrate according to claim 14, wherein
   the stacked body includes a first main surface and a second main surface that oppose each other in a stacking direction of the plurality of resin layers; and
   the coil conductor pattern including the parallel conductor portion is formed closest to the first main surface among the plurality of coil conductor patterns.

19. The method of manufacturing a resin multilayer substrate according to claim 14, wherein a plurality of the coil conductor patterns including the parallel conductor portion are formed.

20. The method of manufacturing a resin multilayer substrate according to claim 19, wherein
   the stacked body includes a first main surface and a second main surface that oppose each other in a stacking direction of the plurality of resin layers; and
   the plurality of the coil conductor patterns including the parallel conductor portion are formed at a position closest to the first main surface and a position closest to the second main surface, respectively, among the plurality of coil conductor patterns.

* * * * *